United States Patent
Chiu

(10) Patent No.: US 10,644,694 B2
(45) Date of Patent: May 5, 2020

(54) POWER-ON RESET CIRCUIT WITH HYSTERESIS

(71) Applicant: Winbond Electronics Corp., Taichung (TW)

(72) Inventor: Liang-Shiang Chiu, Zhubei (TW)

(73) Assignee: WINBOND ELECTRONICS CORP., Taichung (TW)

( * ) Notice: Subject to any disclaimer, the term of this patent is extended or adjusted under 35 U.S.C. 154(b) by 16 days.

(21) Appl. No.: 16/267,774

(22) Filed: Feb. 5, 2019

(65) Prior Publication Data
US 2019/0245535 A1    Aug. 8, 2019

(30) Foreign Application Priority Data
Feb. 8, 2018   (CN) ............................ 2018 1 0126047

(51) Int. Cl.
*H03K 17/22*   (2006.01)
(52) U.S. Cl.
CPC .................................. *H03K 17/223* (2013.01)
(58) Field of Classification Search
CPC .................................................... H03K 17/223
USPC ........................................ 327/142, 143, 198
See application file for complete search history.

(56) References Cited

U.S. PATENT DOCUMENTS

| 5,534,804 A | 7/1996 | Woo |
| 6,366,136 B1 | 4/2002 | Page |
| 2012/0049891 A1* | 3/2012 | Tisinger ............ G01R 31/31703 327/50 |

FOREIGN PATENT DOCUMENTS

WO    WO2009047339 A1    4/2009

* cited by examiner

*Primary Examiner* — John W Poos
(74) *Attorney, Agent, or Firm* — Muncy, Geissler, Olds & Lowe, PC

(57) ABSTRACT

A power-on reset circuit with hysteresis includes a current mirror, a voltage division circuit, a hysteresis control circuit, and a logic driver. The current mirror is coupled to an external supply voltage. The voltage division circuit generates a first control voltage according to the external supply voltage. The hysteresis control circuit generates a second control voltage according to the external supply voltage and the first control voltage. The logic driver generates an output voltage according to the second control voltage. The hysteresis control circuit further defines a first threshold voltage and a second threshold voltage which are different from each other, such that the logic switching state of the output voltage is determined by comparing the external supply voltage with the first threshold voltage or the second threshold voltage.

12 Claims, 5 Drawing Sheets

POWER-ON RESET CIRCUIT WITH HYSTERESIS

CROSS REFERENCE TO RELATED APPLICATIONS

This Application claims priority of China Patent Application No. 201810126047.0 filed on Feb. 8, 2018, the entirety of which is incorporated by reference herein.

BACKGROUND OF THE INVENTION

Field of the Invention

The disclosure generally relates to a power-on reset circuit, and more specifically, to a power-on reset circuit with hysteresis.

Description of the Related Art

A power-on reset circuit ensures that when a circuit board is powered-on, its internal modules can be initialized to known states. However, a conventional power-on reset circuit usually has a single threshold voltage compared with an external supply voltage. If the external supply voltage includes noise, the conventional power-on reset circuit will tend to generate the wrong output voltages, thereby degrading the performance of the whole system. Accordingly, there is a need to propose a novel solution for solving the problems of the prior art.

BRIEF SUMMARY OF THE INVENTION

The invention provides a power-on reset circuit with hysteresis, so as to effectively reduce the probability of the output voltage including errors.

In preferred embodiment, the invention is directed to a power-on reset circuit with hysteresis. The power-on reset circuit includes a current mirror, a voltage division a hysteresis control circuit, and a logic driver. The current mirror is coupled to an external supply voltage. The voltage division circuit is coupled to the current mirror. The voltage division circuit generates a first control voltage according to the external supply voltage. The hysteresis control circuit is coupled to the current mirror and the voltage division circuit. The hysteresis control circuit generates a second control voltage according to the external supply voltage and the first control voltage. The logic driver is coupled to the hysteresis control circuit. The logic driver generates an output voltage according to the second control voltage. The hysteresis control circuit further defines a first threshold voltage and a second threshold voltage according to the output voltage. The first threshold voltage and the second threshold voltage are different from each other. Accordingly, the logic switching state of the output voltage is determined by comparing the external supply voltage with the first threshold voltage or the second threshold voltage.

Based on the above descriptions, since the power-on reset circuit of the invention has a hysteresis function, the invention can effectively improve the accuracy of the power-on reset circuit for rising and falling detections of the external supply voltage.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
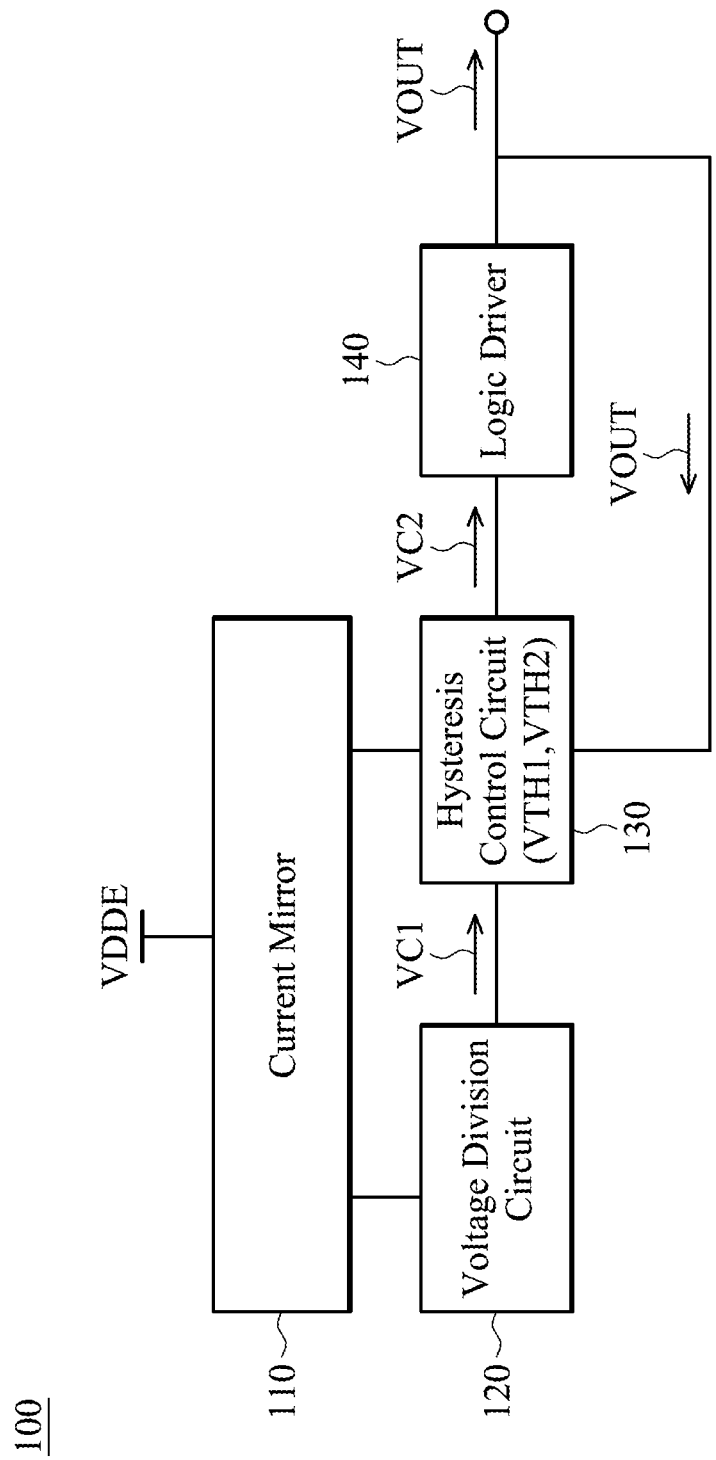
FIG. 1 is a diagram of a power-on reset circuit according to an embodiment of the invention.

FIG. 1 is a diagram of a power-on reset circuit 100 according to an embodiment of the invention. As shown in FIG. 1, the power-on reset circuit 100 includes a current mirror 110, a voltage division circuit 120, a hysteresis control circuit 130, and a logic driver 140. The current mirror 110 is coupled to an external supply voltage VDDE. For example, the external supply voltage VDDE may be generated by an LDO (Low Dropout Linear Regulator) or a DC-to-DC (Direct Current to Direct Current) converter, which is independent of the power-on reset circuit 100 (not shown). The voltage division circuit 120 is coupled to the current mirror 110. The voltage division circuit 120 generates a first control voltage VC1 according to the external supply voltage VDDE. The first control voltage VC1 is usually lower than the external supply voltage VDDE, or is a specific percentage of the external supply voltage VDDE. The hysteresis control circuit 130 is coupled to the current mirror 110 and the voltage division circuit 120. The hysteresis control circuit 130 generates a second control voltage VC2 according to the external supply voltage VDDE and the first control voltage VC1. The logic driver 140 is coupled to the hysteresis control circuit 130. The logic driver 140 generates an output voltage VOUT according to the second control voltage VC2. For example, the output voltage VOUT and the second control voltage VC2 may have the same or complementary logic levels. The power-on reset circuit 100 can use the output voltage VOUT with a stronger current driving capability to drive subsequent digital circuits (not shown). In a preferred embodiment, the hysteresis control circuit 130 further defines a first threshold voltage VTH1 and a second threshold voltage VTH2 according to the output voltage VOUT. The first threshold voltage VTH1 and the second threshold voltage VTH2 are different from each other. Accordingly, the logic switching state of the output voltage VOUT is determined by comparing the external supply voltage VDDE with either the first threshold voltage VTH1 or the second threshold voltage VTH2.

In some embodiments, if the output voltage VOUT and the external supply voltage VDDE are in phase, the first threshold voltage VTH1 may be designed to be higher than the second threshold voltage VTH2. When the external supply voltage VDDE gradually rises and is higher than the first threshold voltage VTH1, the output voltage VOUT of the power-on reset circuit 100 quickly rises to a high logic level (i.e., a logic "1" or the external supply voltage VDDE). Conversely, when the external supply voltage VDDE gradually falls and is lower than the second threshold voltage VTH2, the output voltage VOUT of the power-on reset circuit 100 quickly falls to a low logic level (i.e., a logic "0" or a ground voltage VSS). Because the first threshold voltage VTH1 and the second threshold voltage VTH2 are different from each other, the output rising threshold the output falling threshold, compared with the external supply voltage VDDE, are also different from each other. Therefore, the power-on reset circuit 100 of the invention is considered as hysteresis, so as to effectively reduce the probability of the output voltage VOUT including errors. However, the invention is not limited thereto. In alternative embodiments, if the output voltage VOUT and the external supply voltage VDDE are out of phase, the first threshold voltage VTH1 may be designed to be lower than the second threshold voltage VTH2, and it can provide a similar hysteresis function.

The following embodiments will introduce a variety of detailed circuit configurations of the power-on reset circuit 100. It should be understood that these figures and descriptions are merely exemplary, rather than limitations of the invention.

Figure 2:
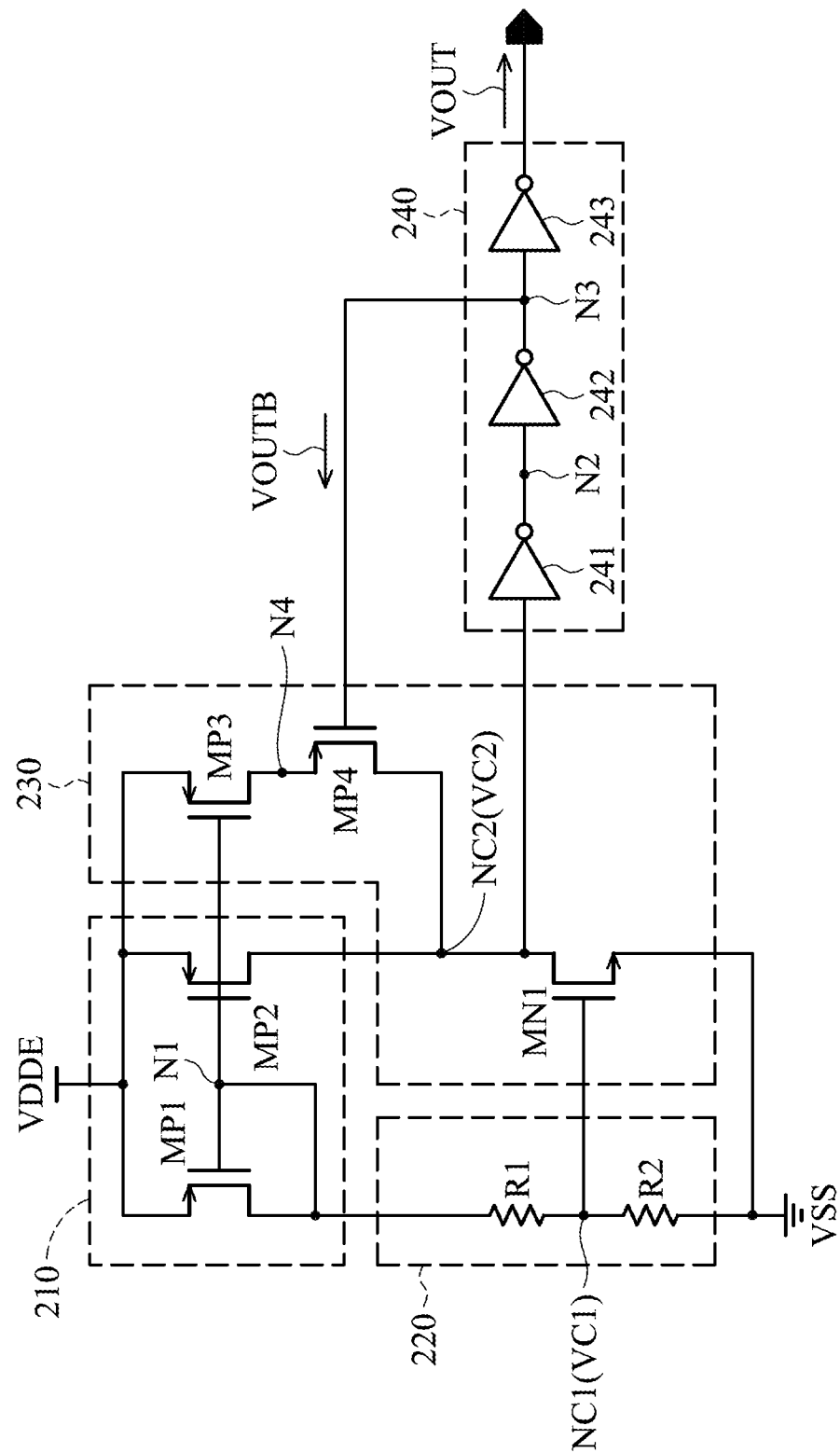
FIG. 2 is a diagram of a power-on reset circuit according to an embodiment of the invention.

FIG. 2 is a diagram of a power-on reset circuit 200 according to an embodiment of the invention. In the embodiment of FIG. 2, the power-on reset circuit 200 includes a current mirror 210, a voltage division circuit 220, a hysteresis control circuit 230, and a logic driver 240. The above elements are arranged as follows.

The current mirror 210 includes a first P-type transistor MP1 and a second P-type transistor MP2. For example, each of the first P-type transistor MP1 and the second P-type transistor MP2 may be a PMOS transistor (P-type Metal Oxide Semiconductor Field Effect Transistor). The first P-type transistor MP1 has a control terminal coupled to the first node N1, a first terminal coupled to an external supply voltage VDDE, and a second terminal coupled to the first node N1. The second P-type transistor MP2 has a control terminal coupled to the first node N1, a first terminal coupled to the external supply voltage VDDE, and a second terminal coupled to a second control node NC2. The second control node NC2 is arranged for outputting a second control voltage VC2. The second control voltage VC2 may be determined by the current mirror 210 and the hysteresis control circuit 230.

The voltage division circuit 220 includes a first resistor R1 and a second resistor R2. The first resistor R1 is coupled between the first node N1 and a first control node NC1. The first control node NC1 is arranged for outputting a first control voltage VC1. The first control voltage VC1 may be determined by the voltage division circuit 220. The second resistor R2 is coupled between the first control node NC1 and a ground voltage VSS (e.g., 0V).

The logic driver 240 includes a first inverter 241, a second inverter 242, and a third inverter 243. For example, the first inverter 241, the second inverter 242, and the third inverter 243 may be all supplied with the external supply voltage VDDE. The first inverter 241 has an input terminal coupled to the second control node NC2 for receiving the second control voltage VC2, and an output terminal coupled to a second node N2. The second inverter 242 has an input terminal coupled to the second node N2, and an output terminal coupled to a third node N3. The third inverter 243 has an input terminal coupled to the third node N3, and an output terminal for outputting an output voltage VOUT.

The hysteresis control circuit 230 includes a third P-type transistor MP3, a fourth P-type transistor MP4, and a first N-type transistor MN1. For example, each of the third P-type transistor MP3 and the fourth P-type transistor MP4 may be a PMOS transistor, and the first N-type transistor MN1 may be an NMOS transistor (N-type Metal Oxide Semiconductor Field Effect Transistor). The first N-type transistor MN1 has a control terminal coupled to the first control node NC1 for receiving the first control voltage VC1, a first terminal coupled to the ground voltage VSS, and a second terminal coupled to the second control node NC2 for outputting the second control voltage VC2. The third P-type transistor MP3 has a control terminal coupled to the first node N1, a first terminal coupled to the external supply voltage VDDE, and a second terminal coupled to a fourth node N4. The fourth P-type transistor MP4 has a control terminal for receiving an inverted output VOUTB, a first terminal coupled to the fourth node N4, and a second terminal coupled to the second control node NC2. The inverted output voltage VOUTB and the output voltage VOUT may have complementary logic levels. For example, the inverted output voltage VOUTB may be from the third node N3 between the second inverter 242 and the third inverter 243. In some embodiments, the ratio of the first P-type transistor MP1's size to the second P-type transistor MP2's size to the third P-type transistor MP3's size is 4:3:1, which is calculated and obtained according to many experiment results and helps to further enhance the performance of the power-on reset circuit 200.

Figure 3:
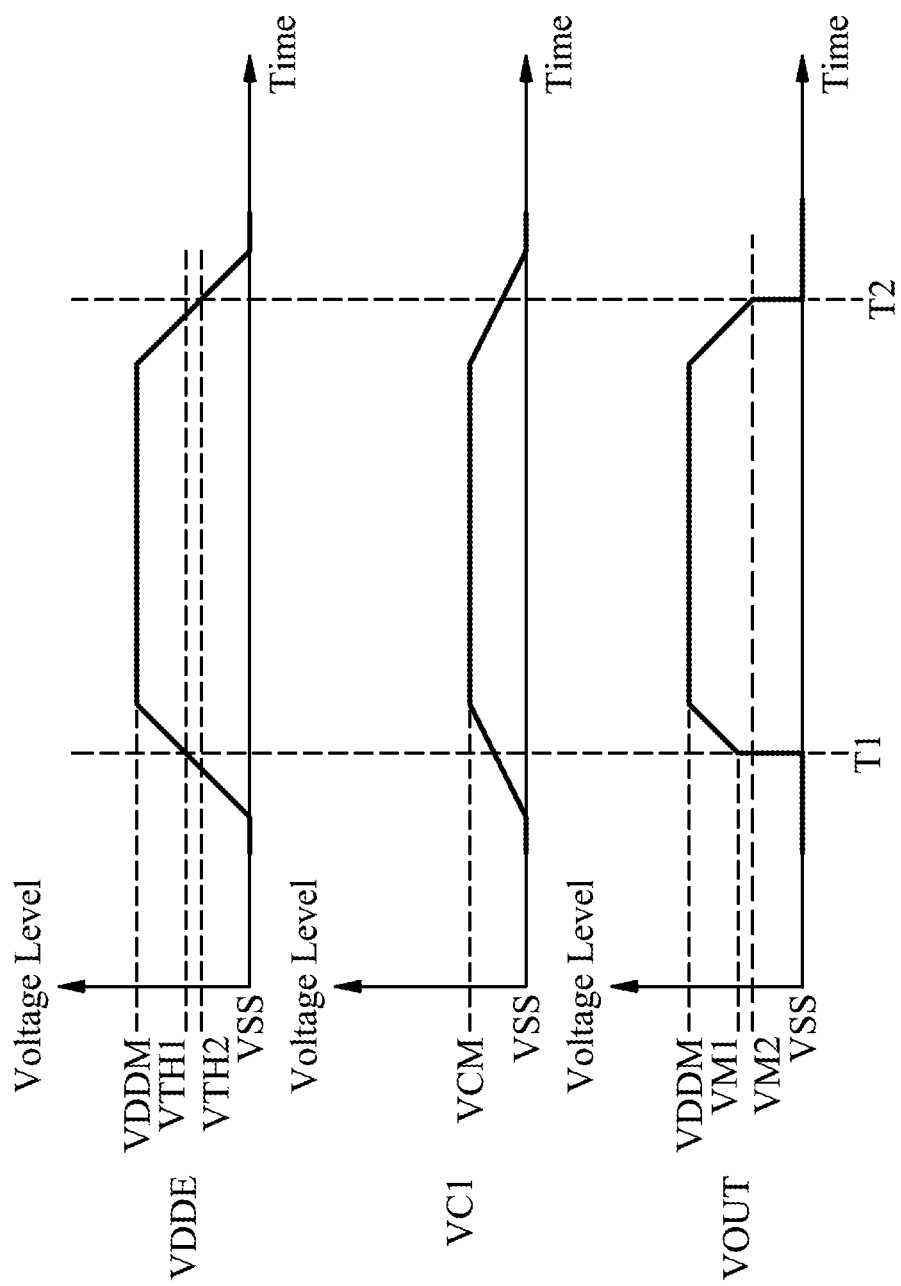
FIG. 3 is a diagram of voltage waveforms of a power-on reset circuit according to an embodiment of the invention.

FIG. 3 is a diagram of voltage waveforms of the power-on reset circuit 200 according to an embodiment of the invention. The horizontal axis represents time, and the vertical axis represents voltage levels. Please refer to FIG. 2 and FIG. 3 together to understand the operation principle of the invention. It should be noted that the first control voltage VC1 may be determined according to the external supply voltage VDDE, and their relationship may be described as the equation (1).

$$VC1 = (VDDE - Vsg) \cdot \frac{R2}{R1 + R2} \qquad (1)$$

where "VC1" represents the voltage level of the first control voltage VC1, "VDDE" represents the voltage level of the external supply voltage VDDE, "Vsg" represents the source-to-gate voltage difference of the first P-type transistor MP1, "R1" represents the resistance of the first resistor R1, and "R2" represents the resistance of the second resistor R2.

Initially, before a first time point T1, the external supply voltage VDDE starts to rise from the ground voltage VSS. Because the voltage levels of the first control voltage VC1 and the second control voltage VC2 are both pulled down to almost the ground voltage VSS by the voltage division circuit 220, the second P-type transistor MP2 is turned on, and the first N-type transistor MN1 is turned off. Accordingly, the second control VC2 is merely charged up by the second P-type transistor MP2, and the output voltage VOUT is stilled maintained at a low logic level (i.e., the ground voltage VSS). At the first time point T1, when the external supply voltage VDDE rises to a first threshold voltage VTH1 the first threshold voltage VTH1 may be determined according to a threshold voltage of the first N-type transistor MN1), the first N-type transistor MN1 is turned on, such that the second control voltage VC2 is coupled to the ground voltage VSS and is discharged down. Since the discharging capability of the first N-type transistor MN1 is generally stronger than the charging capability of the second P-type transistor MP2, the output voltage VOUT can rise to a high logic level. Specifically, the output voltage VOUT quickly rises to a first median voltage VDDM (exactly at the first time point T1), and then gradually rises to the highest voltage VDDM (after the first time point T1). Both the first median voltage VM1 and the highest voltage VDDM are considered as high logic levels. During a stable process between the first time point T1 and a second time point T2, both the external supply voltage VDDE and the output voltage VOUT reach their highest voltage VDDM and the inverted output voltage VOUTB is maintained at the low logic level. The fourth P-type transistor MP4 can be turned on (before the first time point T1, the fourth P-type transistor MP4 is turned off) and the current flowing through the first N-type transistor MN1 is additionally increased because the second P-type transistor MP2 and the third P-type transistor MP3 are coupled in parallel so as to provide currents for the first N-type transistor MN1 at the same time. Next, the external supply voltage VDDE starts to fall from the highest voltage VDDM. At the second time point T2, when the external supply voltage VDDE falls to the second threshold voltage VTH2, the first N-type transistor MN1 is turned off, and the second control voltage VC2 is merely charged up by the second P-type transistor MP2 and the third P-type transistor MP3, such that the output voltage VOUT finally falls to the low logic level. Specifically, the output voltage VOUT gradually falls to second median voltage VM2 (exactly at the second time point T2), and then quickly falls to the ground voltage VSS (after the second time point T2). Both the second median voltage VM2 and the ground voltage VSS are considered as low logic levels. The second median voltage VM2 is usually lower than the first median voltage VM1. It should be noted that if the current flowing through the first N-type transistor MN1 is increased, the impedance of the first N-type transistor MN1 will be decreased, such that the second threshold voltage VTH2 must be lower than the first threshold voltage VTH1. Based on the circuit design of FIG. 2, when the fourth P-type transistor MP4 is turned off, the hysteresis control circuit 130 defines the first threshold voltage VTH1 compared with the external supply voltage VDDE, and when the fourth P-type transistor MP4 is turned on, the hysteresis control circuit 130 defines the second threshold voltage VTH2 compared with the external supply voltage VDDE, thereby achieving the hysteresis performance.

Figure 4:
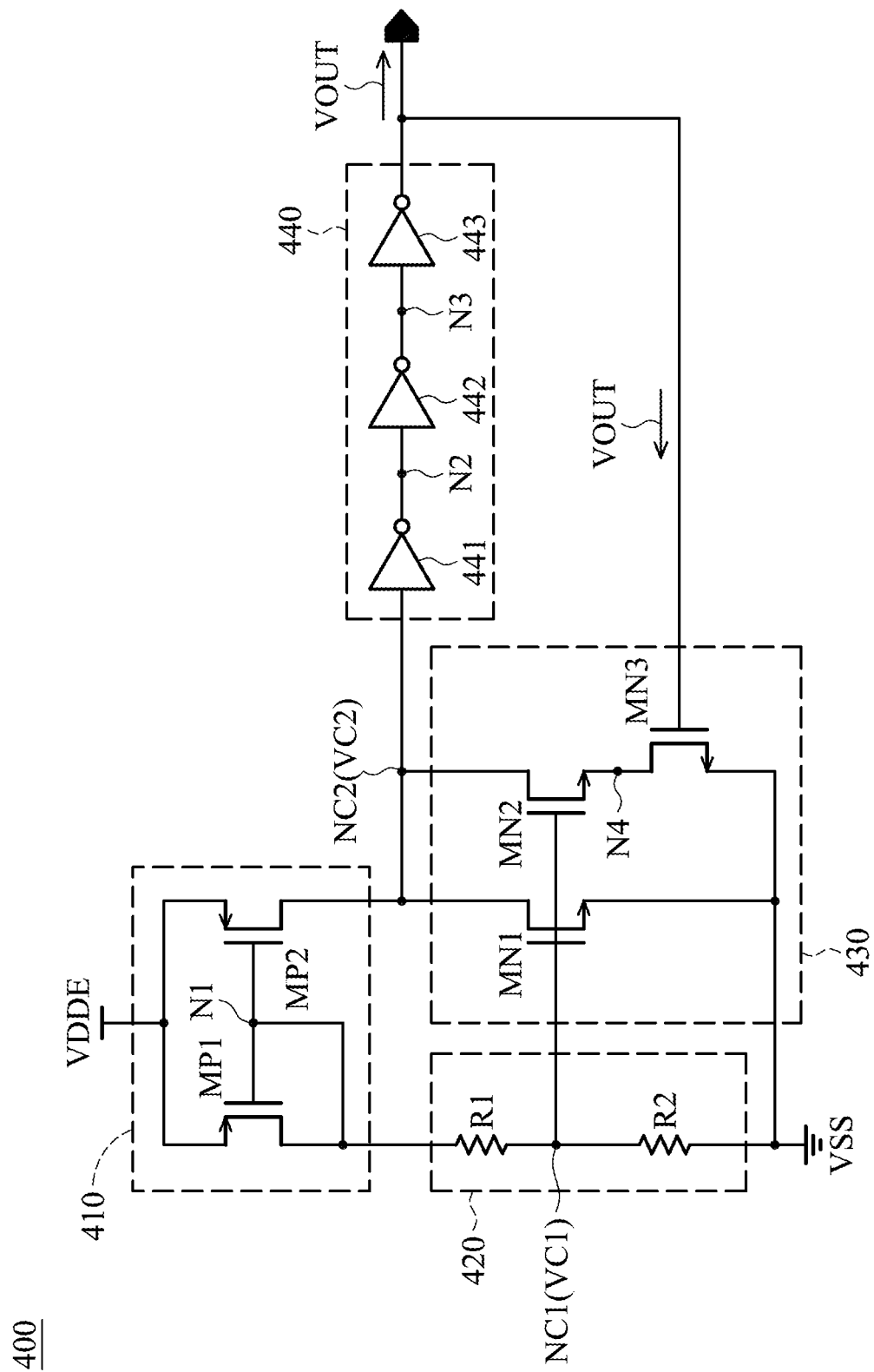
FIG. 4 is a diagram of a power-on reset circuit according to an embodiment of invention.

FIG. 4 is a diagram of a power-on reset circuit 400 according to an embodiment of the invention. In the embodiment of FIG. 4, the power-on reset circuit 400 includes a current mirror 410, a voltage division circuit 420, a hysteresis control circuit 430, and a logic driver 440. The structures and functions of the current mirror 410, the voltage division circuit 420, and the logic driver 440 have been described in the embodiment of FIG. 2.

Similarly, the hysteresis control circuit 430 also generates the second control voltage VC2 at the second control node NC2 according to the external supply voltage VDDE and the first control voltage VC1 at the first control node NC1, so as to control the logic switching state of the output voltage VOUT of the power-on reset circuit 400. Specifically, the hysteresis control circuit 430 includes a first N-type transistor MN1, a second N-type transistor MN2, and a third N-type transistor MN3. For example, each of the first N-type transistor MN1, the second N-type transistor MN2, and the third N-type transistor MN3 may be an NMOS transistor. The first N-type transistor MN1 has a control coupled to the first control node NC1 for receiving the first control voltage VC1, a first terminal coupled to a ground voltage VSS, and a second terminal coupled to the second control node NC2 for defining the second control voltage VC2. The second N-type transistor MN2 has a control terminal coupled to the first control node NC1, a first terminal coupled to a fourth node N4, and a second terminal coupled to the second control node NC2. The third N-type transistor MN3 has a control terminal for receiving the output voltage VOUT, a first terminal coupled to the ground voltage VSS, and a second terminal coupled to the fourth node N4. In some embodiments, the ratio of the first N-type transistor MN1's size to the second N-type transistor MN2's size is 1:4, which is calculated and obtained according to many experiment results and helps to further enhance the performance of the power-on reset circuit 400.

The hysteresis control circuit 430 of FIG. 4 and the hysteresis control circuit 230 of FIG. 2 have similar operation principles. Please refer to the waveforms relative to FIG. 2 so as to understand them. Before the first time point T1, the output voltage VOUT has a low logic level, such that the third N-type transistor MN3 is turned off. During the time period between the first time point T1 and the second time point T2, the output voltage VOUT has a high logic level, such that the third N-type transistor MN3 is turned on. The turned-on third N-type transistor MN3 can enable the second N-type transistor MN2. Accordingly, the first N-type transistor MN1 and the second N-type transistor MN2 are coupled in parallel, and it seems that the first N-type transistor MN1 has a stronger capability in driving currents. With the circuit design of FIG. 4, when the third N-type transistor MN3 is turned off, the hysteresis control circuit 430 defines a first threshold voltage VTH1 compared with the external supply voltage VDDE, and when the third N-type transistor MN3 is turned on, the hysteresis control circuit 430 defines a second threshold voltage VTH2 compared with the external supply voltage VDDE. It should be noted that if the first N-type transistor MN1 has a stronger capability in driving currents, the impedance of the first N-type transistor MN1 will be decreased. Thus, the second threshold voltage VTH2 must be lower than the first threshold voltage VTH1, thereby achieving the hysteresis performance. Other features of the power-on reset circuit 400 of FIG. 4 are similar to those of the power-on reset circuit 200 of FIG. 2. Therefore, the two embodiments can achieve similar levels of performance.

Figure 5:
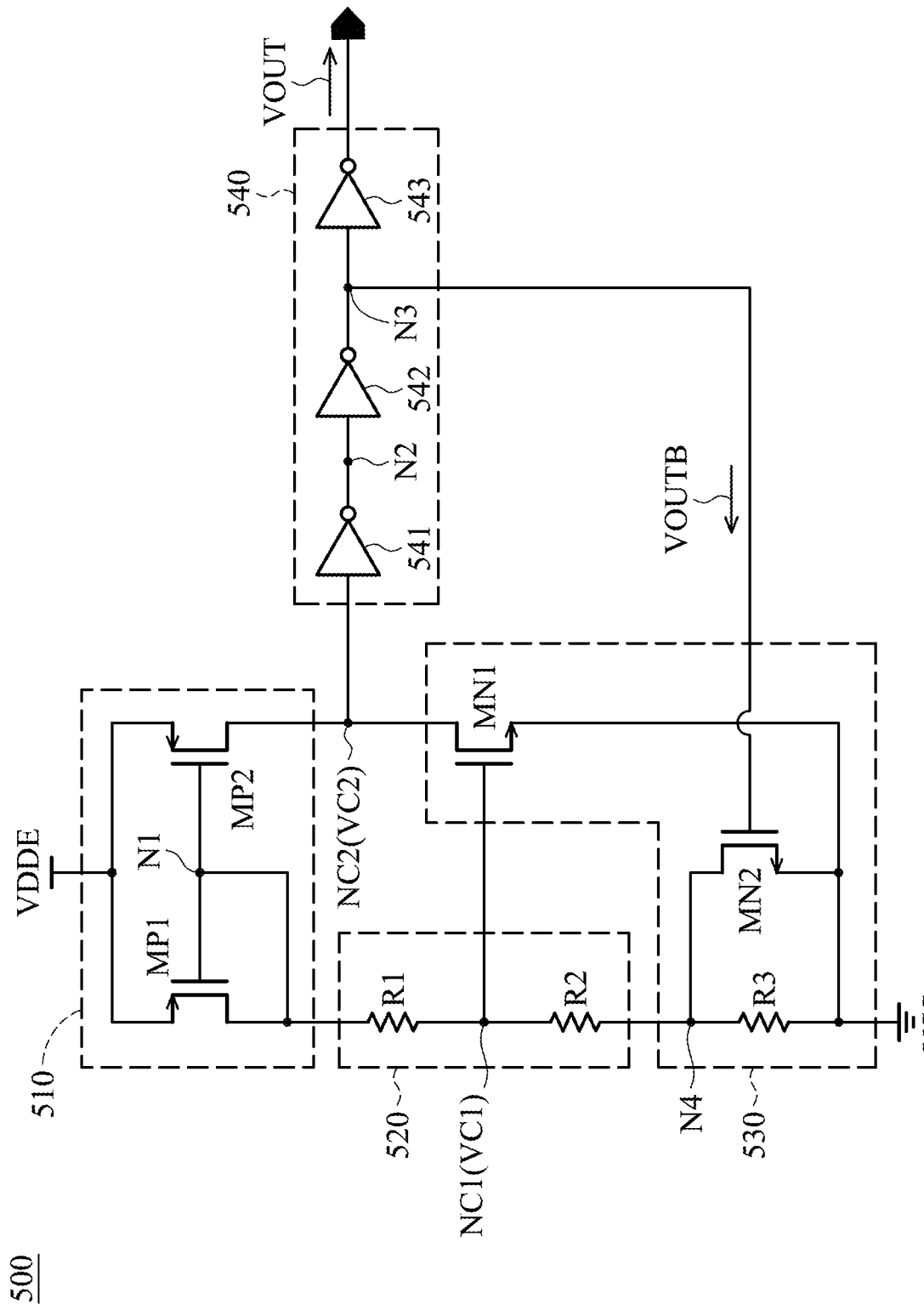
FIG. 5 is a diagram of a power-on reset circuit according to an embodiment of the invention.

FIG. 5 is a diagram of a power-on reset circuit 500 according to an embodiment of the invention. In the embodiment of FIG. 5, the power-on reset circuit 500 includes a current mirror 510, a voltage division circuit 520, a hysteresis control circuit 530, and a logic driver 540. The structures and functions of the current mirror 510, the voltage division circuit 520, and the logic driver 540 have been described in the embodiment of FIG. 2.

Similarly, the hysteresis control circuit 530 also generates the second control voltage VC2 at the second control node NC2 according to the external supply voltage VDDE and the first control voltage VC1 at the first control node NC1, so as to control the logic switching state of the output voltage VOUT of the power-on reset circuit 500. It should be noted that the voltage division circuit 520 includes a first resistor R1 and a second resistor R2. The first resistor R1 is coupled between a first node N1 and the first control node NC1. The second resistor R2 is coupled between the first control node NC1 and a fourth node N4. Specifically, the hysteresis control circuit 530 includes a first N-type transistor MN1, a second N-type transistor MN2, and a third resistor R3. For example, each of the first N-type transistor MN1 and the second N-type transistor MN2 may be an NMOS transistor. The first N-type transistor MN1 has a control terminal coupled to the first control node NC1 for receiving the first control voltage VC1, a first terminal coupled to a ground voltage VSS, and a second terminal coupled to the second control node NC2 for defining the second control voltage VC2. The second N-type transistor MN2 has a control terminal receiving an inverted output voltage VOUTB, a first terminal coupled to the ground voltage VSS, and a second terminal coupled to the fourth node N4. The third resistor R3 is coupled between the fourth node N4 and the ground voltage VSS. The inverted output voltage VOUTB and the output voltage VOUT may have complementary logic levels. For example, the inverted output voltage VOUTB may be from a third node N3 between a second inverter 542 and a third inverter 543 of the logic driver 540.

The hysteresis control circuit 530 of FIG. 5 and the hysteresis control circuit 230 of FIG. 2 have similar operation principles. Please refer to the waveforms relative to FIG. 2 so as to understand them. Before the first time point T1, the inverted output voltage VOUTB has a high logic level, such that the second N-type transistor MN2 is turned on. At this time, the relationship between the first control voltage VC1 and the external supply voltage VDDE has been described as the above equation (1) (the resistance of the third resistor R3 is negligible because there is almost a short-circuited state between two terminals of the third resistor R3). During the time period between the first time point T1 and the second time point T2, the inverted output voltage VOUTB has a low logic level, such that the second N-type transistor MN2 is turned off. At this time, the relationship between the first control voltage VC1 and the external supply voltage VDDE may be described as the equation (2).

$$VC1 = (VDDE - Vsg) \cdot \frac{R2 + R3}{R1 + R2 + R3} \quad (2)$$

where "VC1" represents the voltage level of the first control voltage VC1, "VDDE" represents the voltage level of the external supply voltage VDDE, "Vsg" represents the source-to-gate voltage difference of the first P-type transistor MP1, "R1" represents the resistance of the first resistor R1, "R2" represents the resistance of the second resistor R2, and "R3" represents the resistance of the third resistor R3.

The turned-off second N-type transistor MN2 incorporates the third resistor R3 the voltage division circuit 520. Accordingly, the first control voltage VC1 becomes higher, and it seems that the current flowing through the first N-type transistor MN1 is increased. With the circuit design of FIG. 5, when the second N-type transistor MN2 is turned on, the hysteresis control circuit 530 defines a first threshold voltage VTH1 compared with the external supply voltage VDDE, and when the second N-type transistor MN2 is turned off, the hysteresis control circuit 530 defines a second threshold voltage VTH2 compared with the external supply voltage VDDE. Noted that if the current flowing through the first N-type transistor MN1 is increased, it will be more difficult to turn off the first N-type transistor MN1. Thus, the second threshold voltage VTH2 must be lower than the first threshold voltage VTH1, thereby achieving the hysteresis performance. Other features of the power-on reset circuit 500 of FIG. 5 are similar to those of the power-on reset circuit 200 of FIG. 2. Therefore, the two embodiments can achieve similar levels of performance.

The invention proposes a novel power-on reset circuit. Since the proposed power-on reset circuit of the invention has a hysteresis function, the invention can effectively improve the accuracy of the power-on reset circuit for rising and falling detections of the external supply voltage.

Note that the above element parameters (e.g., voltage values) are not limitations of the invention. A designer can adjust these settings according to different requirements. The power-on reset circuit of the invention is not limited to the configurations of FIGS. 1-5. The invention may merely include any one or more features of any one or more embodiments of FIGS. 1-5. In other words, not all of the features displayed in the figures should be implemented in the power-on reset circuit of the invention.

It will be apparent to those skilled in the art that various modifications and variations can be made in the invention. It is intended that the standard and examples be exemplary only, with the true scope of the disclosed embodiments being indicated by the following claims and their equivalents.

What is claimed is:

1. A power-on reset circuit with hysteresis, comprising:
a current mirror, coupled to an external supply voltage;
a voltage division circuit, coupled to the current mirror, configured to generate a first control voltage according to the external supply voltage, wherein the voltage division circuit comprises:
   a first resistor, coupled between a first node and a first control node, wherein the first control node is arranged for outputting the first control voltage; and
   a second resistor, coupled between the first control node and a ground voltage;
a hysteresis control circuit, coupled to the current mirror and the voltage division circuit, wherein the hysteresis control circuit generates a second control voltage according to the external supply voltage and the first control voltage; and
a logic driver, coupled to the hysteresis control circuit, wherein the logic driver generates an output voltage according to the second control voltage;
wherein the hysteresis control circuit further defines a first threshold voltage and a second threshold voltage which are different from each other according to the output voltage, such that a logic switching state of the output voltage is determined by comparing the external supply voltage with the first threshold voltage or the second threshold voltage; and
wherein when the external supply voltage gradually rises and is higher than the first threshold voltage, the output voltage rises to a high logic level, and wherein when the external supply voltage gradually falls and is lower than the second threshold voltage, the output voltage falls to a low logic level.

2. The power-on reset circuit as claimed in claim 1, wherein the first threshold voltage is higher than the second threshold voltage.

3. The power-on reset circuit as claimed in claim 1, wherein the current mirror comprises:

a first P-type transistor, wherein the first P-type transistor has a control terminal coupled to the first node, a first terminal coupled to the external supply voltage, and a second terminal coupled to the first node; and a second P-type transistor, wherein the second P-type transistor has a control terminal coupled to the first node, a first terminal coupled to the external supply voltage, and a second terminal coupled to a second control node, and wherein the second control node is arranged for outputting the second control voltage.

4. The power-on reset circuit as claimed in claim 3, wherein the logic driver comprises:

a first inverter, wherein the first inverter has an input terminal coupled to the second control node, and an output terminal coupled to a second node;

a second inverter, wherein the second inverter has an input terminal coupled to the second node, and an output terminal coupled to a third node; and a third inverter, wherein the third inverter has an input terminal coupled to the third node, and an output terminal for outputting the output voltage.

5. The power-on reset circuit as claimed in claim 3, wherein the hysteresis control circuit comprises:

a first N-type transistor, wherein the first N-type transistor has a control terminal coupled to the first control node, a first terminal coupled to the ground voltage, and a second terminal coupled to the second control node.

6. The power-on reset circuit as claimed in claim 5, wherein the hysteresis control circuit further comprises:

a third P-type transistor, wherein the third P-type transistor has a control terminal coupled to the first node, a first terminal coupled to the external supply voltage, and a second terminal coupled to a fourth node; and a fourth P-type transistor, wherein the fourth P-type transistor has a control terminal for receiving an inverted output voltage, a first terminal coupled to the fourth node, and a second terminal coupled to the second control node.

7. The power-on reset circuit as claimed in claim 6, wherein when the fourth P-type transistor is turned off, the hysteresis control circuit defines the first threshold voltage compared with the external supply voltage, and wherein when the fourth P-type transistor is turned on, the hysteresis control circuit defines the second threshold voltage compared with the external supply voltage.

8. The power-on reset circuit as claimed in claim 5, wherein the hysteresis control circuit further comprises:

a second N-type transistor, wherein the second N-type transistor has a control terminal coupled to the first control node, a first terminal coupled to a fourth node, and a second terminal coupled to the second control node; and a third N-type transistor, wherein the third N-type transistor has a control terminal for receiving the output voltage, a first terminal coupled to the ground voltage, and a second terminal coupled to the fourth node.

9. The power-on reset circuit as claimed in claim 8, wherein when the third N-type transistor is turned off, the hysteresis control circuit defines the first threshold voltage compared with the external supply voltage, and wherein when the third N-type transistor is turned on, the hysteresis control circuit defines the second threshold voltage compared with the external supply voltage.

10. The power-on reset circuit as claimed in claim 5, wherein the second resistor is coupled between the first control node and a fourth node.

11. The power-on reset circuit as claimed in claim 10, wherein the hysteresis control circuit further comprises:

a third resistor, coupled between the fourth node and the ground voltage; and a second N-type transistor, wherein the second N-type transistor has a control terminal for receiving an inverted output voltage, a first terminal coupled to the ground voltage, and a second terminal coupled to the fourth node.

12. The power-on reset circuit as claimed in claim 11, wherein when the second N-type transistor is turned on, the hysteresis control circuit defines the first threshold voltage compared with the external supply voltage, and wherein when the second N-type transistor is turned off, the hysteresis control circuit defines the second threshold voltage compared with the external supply voltage.

* * * * *